United States Patent [19]

Finkelstein et al.

[11] Patent Number: 5,013,360

[45] Date of Patent: May 7, 1991

[54] SEALING GLASS COMPOSITIONS

[75] Inventors: Leo Finkelstein, San Francisco; Maurice E. Dumesnil, Los Altos Hills; Richard R. Tetschlag, San Jose, all of Calif.

[73] Assignee: VLSI Packaging Materials, Inc., Sunnyvale, Calif.

[21] Appl. No.: 407,470

[22] Filed: Sep. 15, 1989

[51] Int. Cl.$^5$ .......................... C03C 3/12; C03C 3/21; C03C 8/24; C03C 14/00

[52] U.S. Cl. .................... 106/1.23; 428/426; 428/432; 428/433; 428/434; 501/15; 501/17; 501/32; 501/41; 501/44; 501/46

[58] Field of Search ............... 501/15, 32, 17, 41, 501/44, 46; 428/426, 432, 433, 434; 106/1.23

[56] References Cited

U.S. PATENT DOCUMENTS

| | | | |
|---|---|---|---|
| 3,408,212 | 10/1968 | Dumesnil | 501/43 |
| 3,454,408 | 7/1969 | Busdiecker | 501/15 |
| 3,650,778 | 3/1972 | Dumesnil et al. | 501/43 |
| 3,837,866 | 9/1974 | Malmendier et al. | 501/41 |
| 4,186,023 | 1/1980 | Dumesnil et al. | 501/15 |
| 4,743,302 | 5/1988 | Dumesnil et al. | 501/32 |

FOREIGN PATENT DOCUMENTS 1552648 9/1979 United Kingdom .

*Primary Examiner*—Mark L. Bell
*Attorney, Agent, or Firm*—Irell & Manella

[57] ABSTRACT

Fluid, stable glasses useful for low-temperature sealing applications are made by adding jointly bismuth oxide, zinc oxide, phosphorus pentoxide, titania and/or zirconium oxide to the lead oxide vanadium oxide binary. The phosphorus pentoxide may be replaced partially or entirely with niobium pentoxide and/or tantalum oxide.

Sealing glass compositions comprising these low-melting lead-vanadia glasses in powder form and refractory fillers of lower thermal expansion for use in hermetically sealing semiconductor devices in ceramic packages are disclosed. Group V metal oxides, particularly niobium-containing oxides, are preferred fillers. Silver metal is a preferred filler for making die-attach compositions.

45 Claims, No Drawings

SEALING GLASS COMPOSITIONS

TECHNICAL FIELD

This invention relates to novel low-temperature metal oxide glasses. It is particularly concerned with very low-melting sealing glasses with or without compatible refractory fillers capable of sealing hermetically ceramic semiconductor packages in the 350° C. range.

More specifically, it describes a new family of fluid metal oxide sealing glasses which are low-cost substitute for the gold alloy seals widely used in lidding semiconductor ceramic packages.

BACKGROUND

By necessity and design, semiconductor integrated devices have grown into increasingly complex, dense circuits on silicon with extremely fine interconnecting metal lines and ultra-thin dielectric gates. In consequence, very large-scale integrated (VLSI) devices are more sensitive to the thermal processes associated with their last manufacturing stages, and in particular with the final step, sealing each silicon chip in its individual ceramic housing. The increased size and pin count of VLSI devices dictate larger two-dimensional hermetic packages.

Semiconductor ceramic packaging is rapidly evolving into flat geometries such as chip carriers, pin grid arrays, and other surface-mounted packages. These packages are designed with a gold-plated metal lid made of Kovar (same expansion as alumina) bonded with a low-temperature gold solder to a gold-plated metal ring on the surface of the ceramic base. Ceramic packaging represents a major cost factor in the manufacture of integrated circuit devices, much of the cost going into gold usage. Since a primary driving force in the semiconductor industry is continual price reduction, it is clear that cost-reducing material technology will progressively gain importance.

Sealing with gold provides numerous technical advantages. These include a sealing temperature in just the right range to guarantee optimum device reliability (350° C.), excellent seal strength and retained hermeticity under extensive thermal shocks as well as very low moisture entrapment in the inner cavity surrounding the silicon chip.

Lower packaging material cost can be achieved through the use of lead borate sealing glasses. These glasses remain a viable alternative to gold alloy as sealing agents. It is well known in the art that elemental gases and moisture diffusion rates through lead borate and lead borosilicate glasses are extremely low, even lower than through fused silica, which itself is permeable to helium.

Relatively higher seal temperature, however, limits the use of solder glasses since no commercial sealing glass will seal below 420° C. Sealing glasses can at present be used only with semiconductor devices that can tolerate 420 C. or higher. This temperature restriction precludes sealing with glass the newer generation of VLSI and other temperature-sensitive semiconductor circuitry (Group III-V compounds).

To date serious attempts to design a practical and reliable lower temperature (in the range of 300–400° C.) sealing glass have met with formidable technical barriers. The search is hampered by the fact that in the course of new material evolution the design of glasses remains a largely empirical science.

The specifications for a semiconductor ceramicpackage sealing glass are numerous and demanding. Somehow these must be met with one single chemical formulation preferably produced as a glass melt rapidly quenched to room temperature. The basic material and processing requirements for a commercially practical sealing glass can be listed as:

1. a metal oxide mixture in the form of a true solution (homogeneous melt),
2. glass formation during rapid cooling of the melt (solidified liquid),
3. low glass viscosity at seal temperature (350° C.),
4. no tendency to crystallize (glass stability) during seal formation and completion,
5. a reasonably low linear thermal expansion (50 to $110 \times 10^{-7}/°C.$),
6. ease of linear thermal expansion adjustment by the addition of a lower expansion ceramic filler,
7. glass chemical stability (insoluble in water, resistant to acids, alkalies and hot water),
8. good wetting and high bonding strength to alumina ceramic surfaces,
9. no presence in the formula of alkali or other fast-migrating ions (electronic applications) or volatile components that create serious health hazards (such as arsenic oxide, thallium oxide, etc.),
10. capacity of producing a strong, tight and hermetic seal to a glass, metal and ceramic surface and capability of surviving several hundred cycles of thermal shocks, liquid to liquid, condition C (MIL-STD-883), and
11. ease of commercial processing.

In contrast to the lead borate glass system, the lead vanadium oxide binary is another low-temperature glass-forming system of potential interest since the glass corresponding to the $PbO—V_2O_5$ eutectic (one mole PbO to one mole $V_2O_5$) has a soften point at about 250° C., notably lower than the most fluid glass in the lead boron oxide binary (12% $B_2O_3$- 88% PbO).

However, severe obstacles are associated with lead vanadium glasses. Foremost is the problem of thermal instability, particularly when the glass is reduced to a powder (the glass powder will rapidly recrystallize on reheating). Second, the marked tendency for vanadium oxide to lose oxygen and change from the pentavalent ($V_2O_5$) state to the trivalent ($V_2O_3$) state, a refractory su Further, there is the pronounced chemical reactivity of $V_2O_5$ with organic liquids.

Prior Art

Dumesnil and Finkelstein in U.S. Pat. No. 4,743,302 disclosed an approach to the dual condition of thermal and chemical instability of lead vanadia glasses. The problem can be minimized and in some cases eliminated by complexing the glass by the addition of very specific metal oxides and fluorides in the glass formulation. U.S. Pat. No. 4,743,302 describes a new family of multicomponent glasses comprising the joint addition of zinc, bismuth, phosphorus, niobium and/or tantalum oxides to the lead vanadium oxide binary system. Highly fluid and stable solder glasses are produced with softening points in the 200–300° C. range.

Dumesnil et al. in U.S. Pat. No. 3,408,212 describe the effect of adding large quantities of lead fluoride to lead vanadium oxide mixtures. A narrow glassforming region was found to exist in the center of the $PbO-PbF_2-V_2O_5$ ternary diagram with improved glass life stability.

These soft glasses are characterized by very high linear thermal expansion (135 to $155 \times 10^{-7}/°C$.). They are not sufficiently stable to be considered as practical glass sealants.

Malmendier and Sojka (U.S. Pat. No. 3,837,866) describe the addition of. $As_2O_3$ and $As_2O_5$ to both $PbO-V_2O_5$ and $Cs_2O-V_2O_5$ eutectics to prevent early recrystallization and to broaden the compositional area within which stable glasses can be produced. The addition of arsenic oxide tends to increase rapidly the viscosity of the resulting glasses, thus preventing the availability of a fluid, stable solder glass at 300° C. or less.

In U.S. Pat. No. 3,650,778, Dumesnil et al. describe lead-free glass compositions containing 10–60% by weight ZnO, 13–60% $V_2O_5$, 7.5–13% $B_2O_3$ and 10–25% $P_2O_5$.

British Pat. No. 1,552,648 describes a blend of $PbO-V_2O_5-P_2O_5$ glass mixed with up to 50% zirconium phosphate ($ZrO_2 \cdot P_2O_5$) powder.

Busdiecker (U.S. Pat. No. 3,454,408) describes the addition of BaO and ZnO to lead vanadate to produce a high-expansion, low-temperature solder glass. He does not describe the addition of $Bi_2O_3$ which is a necessary and required component in the present invention. Nor does this patent mention $Nb_2O_5$ or $Ta_2O_5$, both of which are highly desirable components of the sealing glass of the present invention.

Disclosure of the Invention

The present invention relates to further modifications (increased glass complexity) to the multicomponent lead vanadium glass described in U.S. Pat. No. 4,723,302.

We have discovered that the addition of even very small quantities of titania and/or zirconia greatly enhances the stability of lead vanadia glasses to a certain class of organic liquid, namely, synthetic printing oils. Further, in the presence of very large amounts of low-expansion refractory filler, these additives stabilize the glass and increase the temperature zone within which the glass will flow without danger of uncontrolled crystallization. They provide a broader working range for the practical application of lead vanadia glasses as very low-temperature sealing glasses on ceramic semiconductor packages.

The novel low-melting glass composition of this invention comprises, in weight percent calculated on an oxide basis:

(a) PbO: 35–50%
(b) $V_2O_5$: 35–50%
(c) $Bi_2O_3$: 0.1–6%
(d) $P_2O_5$, $Nb_2O_5$, $Ta_2O_5$, or combinations thereof: 0.1–8%
(e) ZnO, MgO, CaO, BaO, SrO, or combinations thereof: 0.1–5%
(f) $TiO_2$, $ZrO_2$, or combinations thereof: 0.1–5% wherein the combined weight percent of (c)+(d)+(e)+(f) is in the range of 0.4–24%.

This novel sealing glass has a DTA softening point in the 200–300° C. range, is extremely fluid and stable above 300° C., possesses a long working range, and has remarkably good resistance to high humidity.

Preferred glass compositions of this invention essentially include, in weight percent calculated on an oxide basis:

| (a) | PbO | 35–45% |
| --- | --- | --- |
| (b) | $V_2O_5$ | 35–45% |
| (c) | ZnO | 2–4% |
| (d) | $Bi_2O_3$ | 3–5% |
| (e) | $Nb_2O_5$ | 3–5% |
| (f) | $TiO_2$ | 0–4% |
| (g) | $ZrO_2$ | 0–4% |
| (h) | $P_2O_5$ | 0–4% |
| (i) | $B_2O_3$ | 0–2% |
| (j) | CoO | 0–3% |
| (k) | F | 0–1% | wherein the combined weight percent of (f)+(g) is in the range of 0.1–4%.

Mixtures of the above-described novel glass compositions with about 1–50% by weight, based on the mixture, of a low-thermal-expansion refractory particulate filler, preferably a Group V metal oxide (P-, As-, Sb-, V-, Nb-, Ta-based oxide), are another aspect of the invention.

Mixtures of the above-described novel glass compositions or glass composition-filler mixtures with up to 90% by weight, based on the total mixture of silver or gold powder, are another aspect of the invention.

Modes of Carrying Out the Invention

Depending on the particular sealing application for which the glass is intended, additives or fillers may be combined with the basic components of the glass.

Examples of such additives which are typically incorporated in the glass formulation in amounts up to 3% by weight are: boron oxide, fluorine, tungsten trioxide, molybdenum trioxide, cesium oxide, and the transitional element oxides such as iron, cobalt, manganese, nickel, chromium oxides.

Particulate refractory filler may be added to the glass powder of the invention as a means of controlling the overall thermal expansion and contraction of the resulting sealing glass mixture. Increased amounts of a low thermal expansion refractory filler will correspondingly decrease the linear expansion of the sealing glass, the decrease being practically a linear function of the glass-/filler volume ratio. Such fillers are commonly used to make solder glass suitable for sealing to lower expansion ceramics, glasses, or metals. Close matching of thermal expansion of the sealing glass to the ceramic parts (e.g., alumina, berylia, or steatite parts) to be joined is critical to maintain zero stress in the seal joint. This insures strength and hermeticity under extreme conditions of thermal cycling and thermal shock. It is also known that the presence in a glass of a crystalline second phase is beneficial in strengthening a glass seal. The addition of a particulate filler will minimize crack propagation throughout the glass.

These refractory, low-coefficient-of-thermal-expansion fillers include the conventional low-expansion crystalline ceramic materials found useful in the technology of lead solder glasses: beta eucryptite, spodumene, cordierite, zirconium silicate, zinc silicate (willemite), and titanates such as lead titanate and lead calcium titanate. Also included are refractory fillers made from Column 5 metal oxides in the periodic table (P, As, Sb, V, Nb, and Ta), as listed in Table 1 such as refractory zirconium phosphate, titanium phosphate, calcium zirconium phosphate, calcium titanium phosphate, niobium phosphate, tin phosphate, niobium pentoxide, and its derivatives such as aluminum niobate, niobium titanate, and niobium zirconate.

Table 1 below lists examples of this new class of refractory fillers, together with linear thermal expansion values, where known.

TABLE 1

| Refractory Fillers | Linear Thermal Expansion $10^{-7}/°C.$ (30–350° C.) |
|---|---|
| PHOSPHATES | |
| $Al_2O_3\text{-}P_2O_5$ | 5 |
| $NbPO_5$ | |
| $9Nb_2O_5\text{-}P_2O_5$ | |
| $2ZrO_2\text{-}P_2O_5$ | 17 |
| $2ZrO_2\text{-}0.1Nb_2O_5\text{-}P_2O_5$ | 3 |
| $PTa O_5$ | |
| $PTa_9O_{25}$ | |
| $CaO_{-0.5}Zr_2P_3O_{12}$ | −16 |
| $NaTi_2P_3O_{12}$ | −5 |
| VANADATES | |
| $ZrO_2\text{-}V_2O_5$ | |
| $23Nb_2O_5\text{-}2V_2O_5$ | 0 |
| $9Nb_2O_5\text{-}V_2O_5$ | 0 |
| $VTa_9O_{25}$ | |
| ARSENATES | |
| $2ZrO_2\text{-}0.1As_2O_5\text{-}P_2O_5$ | 10 |
| $PbO\text{-}0.1As_2O_5\text{-}TiO_2$ | −25 |
| ANTIMONATES | |
| $2ZrO_2\text{-}0.1Sb_2O_5\text{-}P_2O_5$ | 10 |
| $PbO\text{-}0.1Sb_2O_5\text{-}TiO_2$ | −25 |
| NIOBATES | |
| $Nb_2O_5$ | −5 |
| $Al_2O_3\text{-}Nb_2O_5$ | 26.5 |
| $PbO\text{-}Nb_2O_5$ | 13 |
| $2PbO\text{-}Nb_2O_5$ | 26 |
| $MgO\text{-}Nb_2O_5$ | 50 |
| $PbO\text{-}0.1Bi_2O_3\text{-}TiO_2\text{-}Nb_2O_5$ | −15 |
| $La_3NbO_7$ | |
| $LaNbO_4$ | |
| $LaNb_3O_9$ | |
| $La_2Nb_{12}O_{33}$ | |
| $ZrO_2\text{-}12Nb_2O_5$ | |
| $3Nb_2O_5\text{-}2TiO_2$ | |
| $Nb_2O_5\text{-}TiO_2$ | |
| TANTALATES | |
| $Ta_2O_5$ | 20 |
| $3PbO\text{-}4Ta_2O_5$ | 65 |
| $PbO\text{-}2Ta_2O_5$ | 40 |
| $La_3TaO_7$ | |
| $LaTaO_4$ | |
| $LaTa_3O_9$ | |
| $La_2Ta_{12}O_{33}$ | |
| $2Nb_2O_5\text{-}Ta_2O_5$ | |
| $Ta_2ZrO_6O_{19}$ | |
| $Ta_6ZrO_{17}$ | |
| $TiTa_2O_7$ | |

The refractory fillers are typically mixed with the glass composition in amounts in the range of 1% to 50% by weight based on the mixture. The mixtures are prepared by introducing the glass and refractory powder into a ball mill and milling in a conventional manner to reduce the bulk components to finely divided particles that are uniformly mixed. Alternatively the glass can be ground separately, screened, and then combined with the filler powder in a V blender.

The resulting glass refractory mixtures may be applied to the work piece as such, or they may be mixed with an organic vehicle to form a paste to coat the work piece which is thereafter heated to melt the glass and produce the seal coating. The organic vehicles are synthetic solvents boiling preferably in the range of 150–220° C., such as butyl carbitol, carbitol acetate, or similar solvents.

A metal powder filler such as silver or gold may be mixed with the glass powder of the invention in amounts up to 90% by weight, usually 70–80%, based on the mixture, for die-attach applications in semiconductor chip packaging. The metal-glass mixture may be formed into a paste by formulation with organic vehicles. A refractory filler such as those described above may be added to the metal-glass mix to control the stress in the bonding interface between an electronic component and its metal, glass, or ceramic substrate.

Although the prime objective in the use of these glasses and glass-filler mixtures of this invention is a low sealing temperature in the 300° C. range, it should be understood that there may be special applications requiring a higher temperature. Thus, no upper limit in temperature is inherent in the application of the glass materials of this invention.

It will be readily understood by those of skill in the glass-making art that litharge ($Pb_3O_4$), lead dioxide ($PbO_2$), or any chemical precursors to the oxides of the compositions described in this application can be used to formulate the glasses. Thus phosphorus pentoxide can also be introduced in the glass batch in a nonvolatile form such as lead phosphate, bismuth phosphate or zinc phosphate. Similarly fluorine can be can be introduced in the glass batch as zinc fluoride or lead fluoride.

The sealing glasses of the invention are coated onto metal, glass, or ceramic parts at thicknesses in the range of about 100–700 microns. These metal, glass, or ceramic parts are usually produced in the form of square or rectangular bodies in sizes ranging from about 6–25 mm per side and 200–2500 microns thick, flat or with a recess. The sealing glass pattern (coating) over the entire surface or around the edges is formed by printing and glazing. These parts are sealed at low temperature on ceramic electronic packages known commercially as sidebrazed packages, chip carriers, and pin grid arrays, as well as metal packages.

The following examples describe the preparation and composition of the sealing glasses of the invention. These examples are not intended to limit the invention in any manner.

EXAMPLE 1

A glass was prepared by mixing 300 grams lead oxide, 300 grams vanadium pentoxide, 21.6 grams zinc oxide, 52.6 grams ammonium orthophosphate, 25 grams bismuth trioxide, 25 grams niobium pentoxide, and 15 grams titanium dioxide.

After heating the mixture in a ceramic crucible at 760° C. for one hour, the melt was poured through cold stainless steel rollers to facilitate subsequent crushing into a powder. The resulting glass flakes had a composition in weight percent:

| | |
|---|---|
| PbO | 42.5% |
| $V_2O_5$ | 42.5 |
| ZnO | 3.0 |
| $Bi_2O_3$ | 3.6 |
| $Nb_2O_5$ | 3.6 |
| $P_2O_5$ | 2.6 |
| $TiO_2$ | 2.2 |

The glass flakes were reduced to a powder by ball milling. The DTA softening point was 250° C. and the linear thermal expansion $110 \times 10^{-7}/°C$. The glass is extremely fluid above 300° C. and remains stable. Recrystallization occurs above 400° C. Bonding to a ceramic surface such as alumina was noted at 350° C.

EXAMPLE 2

A glass similar to Example 1 was prepared by substituting the titanium dioxide by 15 grams of zirconium dioxide. The resulting glass flakes had a composition in weight percent:

| | |
|---|---|
| PbO | 42.5% |
| $V_2O_5$ | 42.5 |
| ZnO | 3.0 |
| $Bi_2O_3$ | 3.6 |
| $Nb_2O_5$ | 3.6 |
| $P_2O_5$ | 2.6 |
| $ZrO_2$ | 2.2 |

The resulting glass powder was very similar to the glass from Example 1 except the DTA softening point was 255° C. and the thermal expansion $108 \times 10^{-7}$/°C.

Additional examples of the sealing glasses of the invention were prepared following the procedure described in Examples 1 and 2. These additional Examples 3–22 are reported in Tables 2 and 3 below. We have found that both titanium dioxide and zirconium dioxide are quite compatible with and easily melted in the lead vanadia glasses containing zinc, bismuth, phosphorus, and niobium oxides. Although zinc oxide may be replaced partially or entirely with magnesium, barium, calcium, and strontium oxides, the resulting glass did not have the fluidity of the glasses in Examples 1 and 2. Thus zinc oxide remains the preferred additive.

TABLE 2

| | (Examples in Weight Percent) | | | | | | | | |
|---|---|---|---|---|---|---|---|---|---|
| Component | 3 | 4 | 5 | 6 | 7 | 8 | 9 | 10 | 11 |
| PbO | 42.25 | 42 | 43 | 42 | 40.5 | 42 | 43.65 | 40.75 | 40.75 |
| $V_2O_5$ | 42.25 | 42 | 43 | 42 | 40.5 | 42 | 43.65 | 40.75 | 40.75 |
| ZnO | 3.5 | 3 | 2.5 | 2.5 | 3.5 | 3 | 3.5 | 3.5 | 3.5 |
| $Bi_2O_3$ | 3.5 | 3.5 | 3.25 | 3.5 | 4.5 | 3.5 | 3.5 | 3.5 | 3.5 |
| $Nb_2O_5$ | 3.5 | 3.5 | 3.25 | 3.5 | 4.5 | 3.5 | 3.5 | 3.5 | 3.5 |
| $P_2O_5$ | 3.5 | 3 | 2.5 | 2.5 | 3.5 | 3 | — | 3.5 | 3.5 |
| $TiO_2$ | 1.5 | 3 | — | 2 | 1.5 | — | — | 1.5 | 1.5 |
| $ZrO_2$ | — | — | 2.5 | 2 | 1.5 | 3 | 0.8 | — | — |
| $B_2O_3$ | — | — | — | — | — | — | 0.6 | 1 | 1 |
| F | — | — | — | — | — | — | 0.8 | — | — |
| $MoO_3$ | — | — | — | — | — | — | — | 2 | — |
| $WO_3$ | — | — | — | — | — | — | — | — | 2 |

TABLE 3

| | (Examples in Weight Percent) | | | | | | | | | | |
|---|---|---|---|---|---|---|---|---|---|---|---|
| Component | 12 | 13 | 14 | 15 | 16 | 17 | 18 | 19 | 20 | 21 | 22 |
| PbO | 42 | 42 | 42 | 42 | 40 | 42 | 42 | 42 | 42 | 42 | 42 |
| $V_2O_5$ | 42 | 42 | 42 | 42 | 42 | 42 | 42 | 42 | 42 | 42 | 42 |
| ZnO | 2.5 | 2.5 | 2.5 | 2.5 | 3.5 | 3.5 | 3.5 | 3.5 | 3.5 | 3.5 | 3.5 |
| $Bi_2O_3$ | 3.5 | 3.5 | 3.5 | 3.5 | 3.5 | 3.5 | 3.5 | 3.5 | 3.5 | 3.5 | 3.5 |
| $Nb_2O_5$ | 3.5 | 3.5 | 3.5 | 3.5 | 3.5 | 3.5 | 3.5 | 3.5 | 3.5 | 3.5 | 2.5 |
| $P_2O_5$ | 3.5 | 3.5 | 3.5 | 3.5 | 3.5 | 3.5 | 3.5 | 3.5 | 3.5 | 3.5 | 3.5 |
| $TiO_2$ | 1 | 1 | 1 | 1 | 1 | 1 | 1 | 1 | 1 | 1 | 1.5 |
| $ZrO_2$ | 1 | 1 | 1 | 1 | 1 | 1 | 1 | 1 | 1 | 1 | — |
| MgO | 1 | — | — | — | — | — | — | — | — | — | — |
| BaO | — | 1 | — | — | — | — | — | — | — | — | — |
| CaO | — | — | 1 | — | — | — | — | — | — | — | — |
| SrO | — | — | — | 1 | — | — | — | — | — | — | — |
| $Cs_2O$ | — | — | — | — | 2 | — | — | — | — | — | — |
| FeO | — | — | — | — | — | 2 | — | — | — | — | — |
| CoO | — | — | — | — | — | — | 2 | — | — | — | — |
| NiO | — | — | — | — | — | — | — | 2 | — | — | — |
| MnO | — | — | — | — | — | — | — | — | 2 | — | — |
| CrO | — | — | — | — | — | — | — | — | — | 2 | — |
| $Ta_2O_5$ | — | — | — | — | — | — | — | — | — | — | 1.5 |

EXAMPLE 23

A glass was prepared by weighing and mixing the following chemicals in powder form: 300 grams lead oxide, grams vanadium pentoxide, 21.6 grams zinc oxide, 52.6 grams ammonium orthophosphate, 25 grams bismuth trioxide, grams niobium pentoxide, 20 grams titanium dioxide, 10 grams tungsten trioxide, 10 grams cobalt oxide, 10 grams boric acid.

The powder mixture was heated in a ceramic crucible at 800° C. for one hour and poured through cold stainless steel rollers (quench mill). The resulting glass flakes had the following composition in weight percent:

| | |
|---|---|
| PbO | 40.8% |
| $V_2O_5$ | 40.8 |
| ZnO | 2.94 |
| $Bi_2O_3$ | 3.4 |
| $Nb_2O_5$ | 3.4 |
| $P_2O_5$ | 2.5 |
| $TiO_2$ | 2.74 |
| $WO_3$ | 1.36 |
| CoO | 1.36 |
| $B_2O_3$ | 0.7 |

EXAMPLE 24

The glass flakes prepared according to Example 23 were ground in a ball mill and the resulting powder screened through a 200-mesh screen. The fine glass powder was mixed with 20 percent by weight, based on the mixture, of zirconium silicate powder ($ZrSiO_4$, a low-expansion, inert ceramic filler) and formed into a paste with 12 percent by weight butyl carbitol acetate.

The resulting paste was screen printed on preoxidized copper alloy lids $\frac{1}{2} \times \frac{1}{2}$ inch $\times 10$ mil thickness (Olin Corp. copper alloy containing a small amount of silicon) dried and heated to melt the sealing glass. The thickness of the fixed glass layer was of the order of 6–8 mils.

EXAMPLE 25

The glass flakes prepared according to Example 23 were ground in a ball mill and the resulting powder passed through a 200-mesh screen. The fine glass powder was mixed with 30 percent by weight, based on the mixture, niobium pentoxide ($Nb_2O_5$), a refractory metal oxide with an expansion of $-5 \times 10^{-7}$/°C., and formed into a paste with 12% butyl carbitol acetate.

The resulting paste was screen printed on alumina parts (brown 92% alumina, balance $SiO_2$, MnO, FeO, NiO), dried and heated to about 360° C. to melt the sealing glass material. The thickness of the fused glass layer was of the order of 200 microns.

The glazed alumina parts were inverted and held in position by pressure exerted by a metal clip to a conventional microelectronic base. The structure was heated at a rate of 75° C. per minute to a peak of 370° C. for ten minutes, then cooled to room temperature to produce a tight, strong vitreous seal. The structure was tested for gross and fine leak ($5 \times 10^{-9}$ cc/sec He). The parts were then subjected to 100 cycles of liquid-to-liquid thermal shock, condition C (MIL-STD-883), demonstrating the unusually strong nature of the sealing glass of this invention.

EXAMPLE 26

The glazed alumina parts from Example 25 were positioned on conventional side-brazed semiconductor packages constructed of multilayer alumina with a gold-plated metal ring normally used for sealing gold-plated Kovar lids with gold alloy. After sealing through a belt furnace in air at about 360° C. for 8 minutes, the glass-sealed packages were subjected to gross and fine leak measurement and to 100 cycles thermal shock, liquid to liquid, condition C (MIL-STD-883). All the packages passed the test, thus demonstrating the unusual flexibility of this type of sealing glass capable of bonding to either a ceramic surface or a gold-plated surface. This test was repeated with alumina packages of different geometries such as pressed parts, pin-grid arrays, and chip carriers, with or without a gold ring, with similar results.

EXAMPLE 27

The glass flakes prepared according to Example 9 were ground in a ball mill and the resulting powder screened through a 200-mesh screen. The fine glass powder was mixed with 30% by weight, based on the mixture, $Nb_2O_5$, and formed into a printing paste with about 12% by weight butyl carbitol acetate.

The paste was screen printed on gold-plated Kovar metal lids ½ inch by ½ inch by 10 mil thickness to form a ring of glass 50 mils wide. The parts were dried and heated to melt and bond the sealing glass glass was of the order of 6 mils.

These glass-coated, gold-plated Kovar parts were inverted and held in position with a metal clip to a conventional bare alumina package possessing no metal seal ring on its surface. The structure was heated at a rate of 75° C. per minute to a peak of 360° C. for 10 minutes, then cooled to room temperature to produce a tight vitreous seal between the alumina surface of the package and the gold-plated Kovar lid. The structure was tested for gross and fine leak and then subjected to 100 cycles of thermal shock, condition C (MIL-STD-883) with no mechanical or hermetic failure. This test demonstrates anew the versatility of the glass material of this patent in being able to bond to both a ceramic, surface and a metal such as gold.

EXAMPLE 28

The sealing glass powder was prepared by combining glass from Example 9 with 28 percent by weight niobium pentoxide (based on the mixture) and applied on transparent glass windows with closely matched thermal expansion to alumina. These glass lids were bonded to optoelectronic semiconductor packages and the structures tested for gross and fine leaks. The packages were subjected to 15 cycles thermal shock, condition C, with no hermetic failure.

EXAMPLE 29

The glass powders prepared according to Examples 1-22 are mixed in varying amounts with different types of low expansion refractory powder including those listed in Table 1.

It should be obvious to one skilled in the arts that the choice and quantity of filler to admix with a particular glass from this invention is a function of compatibility, thermal expansion differential, particle size distribution, and the type of ceramic parts to be bonded, or metal or glass substrate. The maximum ratio of filler to glass powder is limited by the onset of lack of flow of the sealing glass when melted.

In general, the lead vanadium glasses described in this invention are preferably mixed with Group V-type refractory fillers as listed in Table 1 above.

EXAMPLE 30

The process described in Example 25 was repeated using niobium pentoxide containing 5 and 10 percent alumina introduced by high temperature sintering with identical results on alumina, glass, and metal parts.

EXAMPLE 31

The glass powder prepared according to Example 22 was blended with 75 percent by weight silver metal powder. About 12 percent by weight Texanol solvent was added to the powder mixture to form a silicon die-attach paste. After roll milling the paste to produce a welldispersed flowing paste, a small quantity of the silverglass paste was deposited on a ceramic surface.

A silicon semiconductor ship was then imbedded in the paste. After controlled drying the structure was slowly heated to about 400° C. to produce a strong bond between the silicon chip and its substrate.

I claim:

1. A low-melting glass composition comprising, in weight percent calculated on an oxide basis:
   (a) PbO: 35-50%
   (b) $V_2O_5$: 35-50%
   (c) $Bi_2O_3$: 0.1-6%
   (d) $P_2O_5$, $Nb_2O_5$, $Ta_2O_5$, or combinations thereof: 0.1-8%
   (e) ZnO, MgO, CaO, BaO, SrO, or combinations thereof: 0.1-5%
   (f) $TiO_2$, $ZrO_2$, or combinations thereof: 0.1-5%
   wherein the combined weight percent of (c)+(d)+(e)+(f) is in the range of 0.4-24%.

2. The low-melting glass of claim 1 wherein the composition includes at least one additive selected from the group consisting of:
   up to 3% by weight $B_2O_3$,
   up to 3% by weight F.,
   up to 3% by weight FeO, CoO, NiO, MnO, and/or CrO,
   up to 3% by weight $WO_3$,
   up to 3% by weight $MoO_3$, and
   up to 3% by weight $Cs_2O$.

3. A low-melting glass composition comprising, in weight percent calculated on an oxide basis:

| (a) | PbO | 35-45% |
| (b) | $V_2O_5$ | 35-45% |
| (c) | ZnO | 2-4% |
| (d) | $Bi_2O_3$ | 3-5% |
| (e) | $Nb_2O_5$ | 3-5% |
| (f) | $TiO_2$ | 0-4% |
| (g) | $ZrO_2$ | 0-4% |
| (h) | $P_2O_5$ | 0-4% |
| (i) | $B_2O_3$ | 0-2% |
| (j) | CoO | 0-3% |
| (k) | F | 0-1% | wherein the combined weight percent of (f)+(g) is in the range of 0.1-4%.

4. The glass of claim 1 mixed with about 1% to about 50% by weight, based on the mixture, of a refractory filler powder with a low coefficient of linear expansion.

5. The glass of claim 4 wherein the filler is a Group V metal oxide.

6. The glass of claim 5 wherein the filler is a niobium-containing oxide, a phosphate, or a tantalum-containing oxide.

7. The glass of claim 5 wherein the filler is niobium pentoxide.

8. The glass of claim 2 mixed with about 1% to about 50% by weight, based on the mixture, of a refractory filler powder with a low coefficient of linear expansion.

9. The glass of claim 8 wherein the filler is a Group V metal oxide.

10. The glass of claim 9 wherein the filler is a niobium-containing oxide, a phosphate, or a tantalum-containing oxide.

11. The glass of claim 9 wherein the filler is niobium pentoxide.

12. The glass of claim 3 mixed with about 1% to about 50% by weight, based on the mixture, of a refractory filler powder with a low coefficient of linear expansion.

13. The glass of claim 12 wherein the filler is a Group V metal oxide.

14. The glass of claim 13 wherein the filler is a niobium-containing oxide, a phosphate, or a tantalum-containing oxide.

15. The glass of claim 13 wherein the filler is niobium pentoxide.

16. The glass of claim 1 mixed with up to 90% by weight, based on the mixture, of silver or gold powder.

17. The glass of claim 2 mixed with up to 90% by weight, based on the mixture, of silver or gold powder.

18. The glass of claim 3 mixed with up to 90% by weight, based on the mixture, of silver or gold powder.

19. The glass of claim 4 mixed with up to 90% by weight, based on the mixture, of silver or gold powder.

20. The glass of claim 5 mixed with up to 90% by weight, based on the mixture, of silver or gold powder.

21. The glass of claim 6 mixed with up to 90% by weight, based on the mixture, of silver or gold powder.

22. The glass of claim 7 mixed with up to 90% by weight, based on the mixture, of silver or gold powder.

23. The glass of claim 8 mixed with up to 90% by weight, based on the mixture, of silver or gold powder.

24. The glass of claim 9 mixed with up to 90% by weight, based on the mixture, of silver or gold powder.

25. The glass of claim 10 mixed with up to 90% by weight, based on the mixture, of silver or gold powder.

26. The glass of claim 11 mixed with up to 90% by weight, based on the mixture, of silver or gold powder.

27. The glass of claim 12 mixed with up to 90% by weight, based on the mixture, of silver or gold powder.

28. The glass of claim 13 mixed with up to 90% by weight, based on the mixture, of silver or gold powder.

29. The glass of claim 14 mixed with up to 90% by weight, based on the mixture, of silver or gold powder.

30. The glass of claim 15 mixed with up to 90% by weight, based on the mixture, of silver or gold powder.

31. An article of manufacture for use in sealing an electronic part comprising a metal, glass, or ceramic body coated with a pattern of the glass composition of claim 1.

32. An article of manufacture for use in sealing an electronic part comprising a metal, glass, or ceramic body coated with a pattern of the glass composition of claim 2.

33. An article of manufacture for use in sealing an electronic part comprising a metal, glass, or ceramic body coated with a pattern of the glass composition of claim 3.

34. An article of manufacture for use in sealing an electronic part comprising a metal, glass, or ceramic body coated with a pattern of the glass composition of claim 4.

35. An article of manufacture for use in sealing an electronic part comprising a metal, glass, or ceramic body coated with a pattern of the glass composition of claim 5.

36. An article of manufacture for use in sealing an electronic part comprising a metal, glass, or ceramic body coated with a pattern of the glass composition of claim 6.

37. An article of manufacture for use in sealing an electronic part comprising a metal, glass, or ceramic body coated with a pattern of the glass composition of claim 7.

38. An article of manufacture for use in sealing an electronic part comprising a metal, glass, or ceramic body coated with a pattern of the glass composition of claim 8.

39. An article of manufacture for use in sealing an electronic part comprising a metal, glass, or ceramic body coated with a pattern of the glass composition of claim 9.

40. An article of manufacture for use in sealing an electronic part comprising a metal, glass, or ceramic body coated with a pattern of the glass composition of claim 10.

41. An article of manufacture for use in sealing an electronic part comprising a metal, glass, or ceramic body coated with a pattern of the glass composition of claim 11.

42. An article of manufacture for use in sealing an electronic part comprising a metal, glass, or ceramic body coated with a pattern of the glass composition of claim 12.

43. An article of manufacture for use in sealing an electronic part comprising a metal, glass, or ceramic body coated with a pattern of the glass composition of claim 13.

44. An article of manufacture for use in sealing an electronic part comprising a metal, glass, or ceramic body coated with a pattern of the glass composition of claim 14.

45. An article of manufacture for use in sealing an electronic part comprising a metal, glass, or ceramic body coated with a pattern of the glass composition of claim 15.

* * * * *